(12) United States Patent
Hiltunen

(10) Patent No.: US 7,268,335 B2
(45) Date of Patent: Sep. 11, 2007

(54) IMAGE SENSING DEVICES, IMAGE SENSOR MODULES, AND ASSOCIATED METHODS

(75) Inventor: Jari Hiltunen, Mouhijarvi (FI)

(73) Assignee: Omnivision Technologies, Inc., Sunnyvale, CA (US)

( * ) Notice: Subject to any disclaimer, the term of this patent is extended or adjusted under 35 U.S.C. 154(b) by 0 days.

(21) Appl. No.: 11/342,107

(22) Filed: Jan. 27, 2006

(65) Prior Publication Data

US 2007/0176086 A1    Aug. 2, 2007

(51) Int. Cl.
*H05N 5/225* (2006.01)
(52) U.S. Cl. .................. 250/208.1; 250/239
(58) Field of Classification Search ........... 250/208.1, 250/239; 348/340, 374
See application file for complete search history.

(56) References Cited

U.S. PATENT DOCUMENTS 7,110,033 B2 *   9/2006   Miyake ................. 348/340

2001/0050721 A1 * 12/2001 Miyake .................. 348/374
2002/0065102 A1 *  5/2002 Miyake et al. ........... 455/556
2004/0212718 A1   10/2004 Hiltunen et al.

OTHER PUBLICATIONS

U.S. Appl. No. 11/220,452, Hiltunen.

* cited by examiner

*Primary Examiner*—John R. Lee
(74) *Attorney, Agent, or Firm*—Blakely Sokoloff Taylor & Zafman LLP

(57) ABSTRACT

The present invention relates to image sensing devices, image sensor modules, and associated methods. One aspect of the invention is directed toward an imaging device that includes a carrier having a first surface, a second surface generally opposite the first surface, and carrier contacts. The carrier contacts are carried on the second surface of the carrier. The device further includes an image sensor module having light sensing elements and a support. The support has a first surface, a second surface generally opposite the first surface, and support contacts. The image sensor module is located relative to the carrier so that a portion of the first surface of the support faces a portion of the second surface of the carrier and so that a portion of the image sensor module extends past the first and second surfaces of the carrier.

20 Claims, 7 Drawing Sheets

IMAGE SENSING DEVICES, IMAGE SENSOR MODULES, AND ASSOCIATED METHODS

TECHNICAL FIELD

The present invention relates to image sensing devices, image sensor modules, and associated methods, including an image sensor module that is couplable to a carrier so that a first portion of the image sensor module is located on one side of the carrier and a second portion of the image sensor module is located on another side of the carrier.

BACKGROUND

Image sensors have become ubiquitous. They are widely used in digital still cameras, cellular phones, security cameras, medical equipment, automobiles, and other applications. The technology used to manufacture image sensors, and in particular CMOS and CCD image sensors, has continued to advance at a great pace. For example, the demands of higher resolution, lower power consumption, and smaller devices have encouraged the further miniaturization and integration of the image sensor and associated elements.

FIG. 1 is a partially schematic cross-sectional illustration of a portion of a cellular phone 5 with a camera module 20 mounted to a printed circuit board 10 in accordance with the prior art. In FIG. 1 the camera module 20 is mounted to the printed circuit board 10 via a socket 60. The socket 60 is configured to physically and electrically couple the camera module 20 to the printed circuit board 10. The camera module 20 includes a housing 22 that carries an image sensor die 25 with pixels and integrated circuits, color filters 29, lenses 28, and an additional processor 27 with additional integrated circuits. Additionally, the camera module 20 includes passive electronic components such as resistors or capacitors. In FIG. 1, first passive electronic components 30a are carried inside the housing 22 of the camera module 20 and second passive electronic components 30b are carried outside the housing 22.

Because the first passive electronic components 30a are carried inside the housing 22, the housing must be large enough in the X direction or in width W to accommodate the first passive electronic components 30a. The second passive electronic components 30b are positioned on a bottom portion of the camera module. In order to keep the height H, or dimension in the Z direction, of the camera module 20 and printed circuit board 10 combination small, the socket 60 has been configured to allow the second passive electronic components 30b to extend past the socket 60 and into a cavity 17 in the printed circuit board 10, as shown in FIG. 1. It can be expensive and time consuming during the production process to produce the cavity 17 in the printed circuit board 10. Furthermore, in many cases, the use of the cavity with the external mounted electronic components does little to reduce the overall height of the camera module and printed circuit board arrangement.

SUMMARY

Aspects of the present invention are directed toward image sensing devices, image sensor modules, and associated methods. Certain aspects of the invention are directed toward an imaging device that includes a carrier having a first surface, a second surface generally opposite the first surface, and carrier contacts. The carrier contacts are carried on the second surface of the carrier. The device further includes a conductive deformable gasket element and an image sensor module having light sensing elements and a support. The support has a first surface, a second surface generally opposite the first surface, and support contacts. The support contacts are carried on the first surface of the support. The light sensitive elements are coupled to the first surface of the support and located relative to the support at least approximately opposite the second surface of the support. The image sensor module is located relative to the carrier so that a portion of the first surface of the support faces a portion of the second surface of the carrier. A conductive deformable gasket element is positioned between at least one of the carrier contacts and at least one of the support contacts to operably couple the at least one support contact to the at least one carrier contact. At least a portion of the image sensor module extends away from the support past the first and second surfaces of the carrier.

Other aspects of the invention are directed toward an imaging device that includes a carrier having a first surface, a second surface at least approximately opposite the first surface, and carrier contacts. The device further includes an image sensor module having light sensing elements, an electronic component, and a support. The support has a first surface, a second surface at least approximately opposite the first surface, and support contacts. The electronic component is carried on the second surface of the support. The light sensitive elements are coupled to the first surface of the support and located relative to the support at least approximately opposite the second surface of the support. The image sensor module is located relative to the carrier so that a portion of the first surface of the support faces a portion of the second surface of the carrier. At least one of the support contacts is operably coupled to at least one of the carrier contacts. At least a portion of the image sensor module extends away from the support past the first and second surfaces of the carrier.

Still other aspects of the invention are directed toward a method for making an imaging device that includes selecting a carrier that has a first surface, a second surface at least approximately opposite the first surface, and carrier contacts. The method further includes positioning an image sensor module having a support with a first and second surface relative to the carrier so that a portion of the first surface of the support faces a portion of the second surface of the carrier and so at least a portion of the image sensor module extends away from the support past the first and second surfaces of the carrier. The second surface of the support is at least approximately opposite the first surface of the support. The image sensor module has light sensing elements, an electronic component, and support contacts. The electronic component is carried on the second surface of the support. The light sensitive elements are coupled to the first surface of the support and located relative to the support at least approximately opposite the second surface of the support. The method still further includes operably coupling at least one of the support contacts to at least one of the carrier contacts.

DETAILED DESCRIPTION

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

References throughout the specification to "one embodiment" or "an embodiment" means that a particular feature, structure, or characteristic described in connection with the embodiment is included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

FIGS. 2-15 illustrate portions of various image sensing devices, image sensor modules, and associated methods in accordance with various embodiments of the invention. In certain embodiments, the overall width and/or height of an image sensor module and carrier arrangement can be reduced as compared to current systems.

Figure 1:
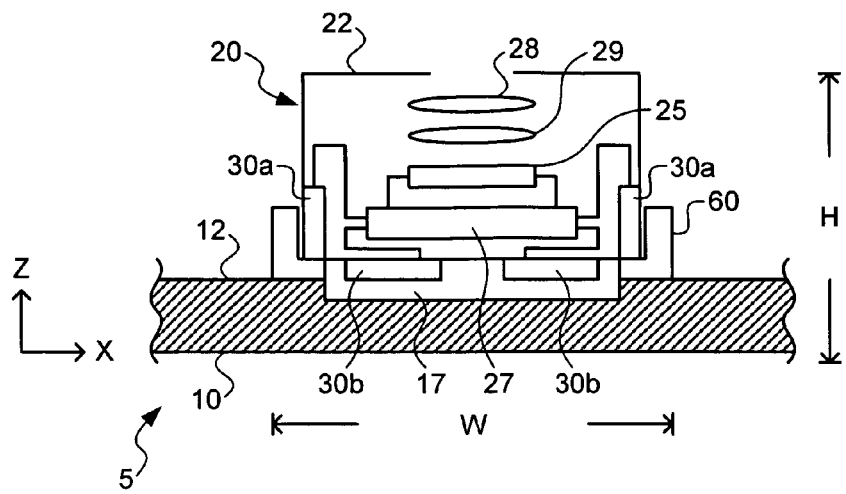
FIG. 1 is a partially schematic cross-sectional illustration of a camera module mounted to a printed circuit board in accordance with the prior art.
Figure 2:
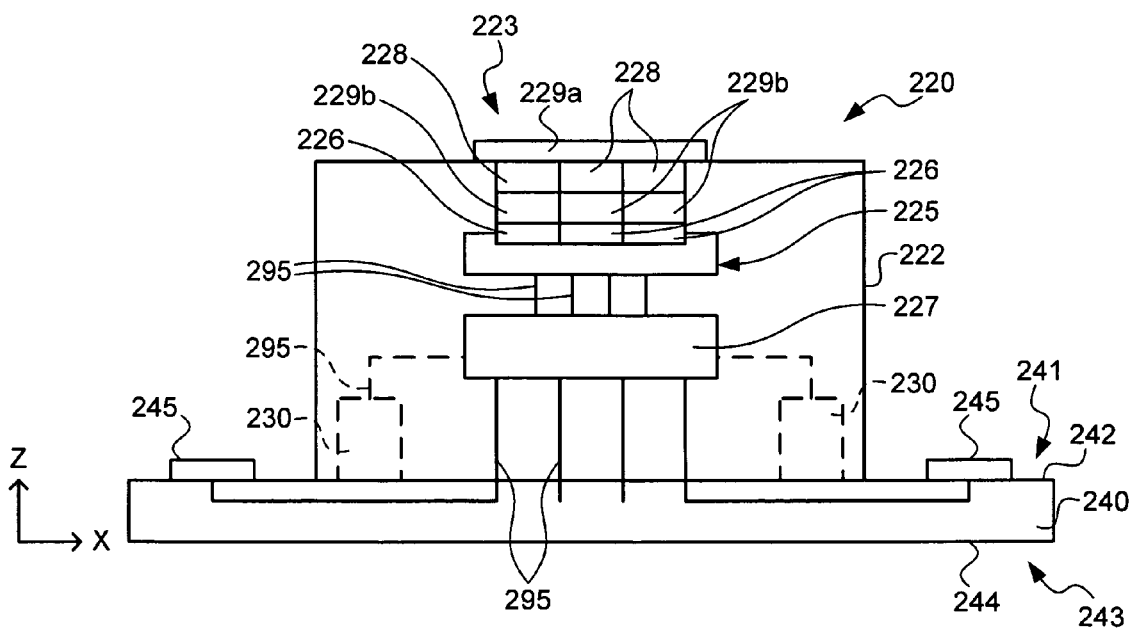
FIG. 2 is a partially schematic cross-sectional illustration of an image sensor module in accordance with embodiments of the present invention.

FIG. 2 is a partially schematic cross-sectional illustration of an image sensor module 220 in accordance with embodiments of the present invention. In the illustrated embodiment, the image sensor module 220 includes an image sensor die 225 that has pixels with light sensing elements 226. The image sensor die 225 can be carried in a housing 222 with an aperture 223 that is configured to allow light to pass from the exterior of the housing 222 to the interior of the housing 222. The image sensor die 225 can be positioned relative to the aperture 223 so that light can pass from the exterior of the housing 222 onto the light sensing elements 226. The image sensor module 220 can also include micro lenses 228 and other optical devices (collectively 229) including a transparent layer or cover 229a over (or in) the aperture 223 in the housing 222 and color filters 229b over the light sensing elements 226. The image sensor module 220 can also include additional integrated circuits 227 (e.g., a processing chip) and other electronic components 230, for example, passive electronic components such as fuses, capacitors, inductors, magnetic amplifiers, piezoelectric crystals, polyswitches, resistors, varistors, and transformers.

In the illustrated embodiment, the image sensor die 225 with the light sensing elements 226 is carried on a support 240 having a first side 241 with a first surface 242 and a second side 243 with a second surface 244. The first side 241 and the first surface 242 are at least approximately opposite the second side 243 and the second surface 244. In FIG. 2, the image sensor die 225 with the light sensing elements 226 and the housing 222 are coupled to the first side 241 of a support 240 and located on the first side of the support 241 (e.g., located relative to the support at least approximately opposite the second surface 244 of the support 240). In the illustrated embodiment, light sensing elements are carried inside the housing 222 of the image sensor module 220 and the housing 222 is carried on the first surface 242 of the support and extends away from the support 240 in the Z direction. The support 240 includes support contacts 245 carried on the first surface 242 of the support 240.

Figure 3:
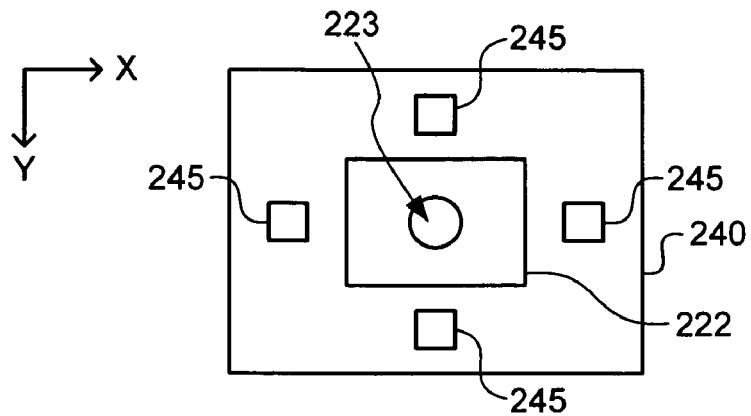
FIG. 3 is a partially schematic top plan view of the image sensor module shown in FIG. 2.

The support contacts are operably (e.g., electrically) coupled to the other components of the light sensor module 220 (e.g., the light sensor die 225, the light sensing elements 226, the other integrated circuits 227, and/or the other electronic components 230 via various pathways 295). FIG. 3 is a partially schematic top plan view of the image sensor module shown in FIG. 2. In the illustrated embodiment, the support contacts 245 are carried around the housing 222 on the first surface 242 of the support 240.

In other embodiments, the camera module can have other arrangements, including more, fewer, and/or different components or elements. For example, in selected embodiments the camera module can include a wafer level camera module as disclosed in U.S. patent application Ser. No. 11/220,452, entitled COATED WAFER LEVEL CAMERA MODULES AND ASSOCIATED METHODS, filed Sep. 7, 2005, which is fully incorporated herein by reference. Additionally, the image sensor module can be configured to sense or image any type of electromagnetic radiation suitable for imaging, referred to herein as light, including visible light, infrared light, and the like.

Figure 4:
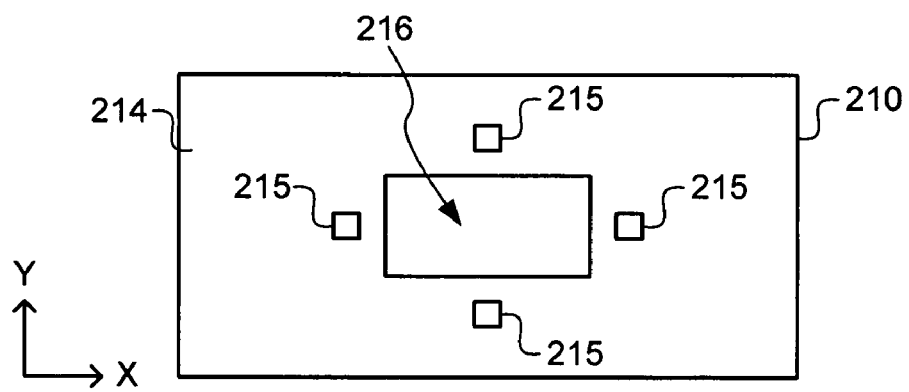
FIG. 4 is a partially schematic bottom plan view of a carrier in accordance with selected embodiments of the present invention.
Figure 5:
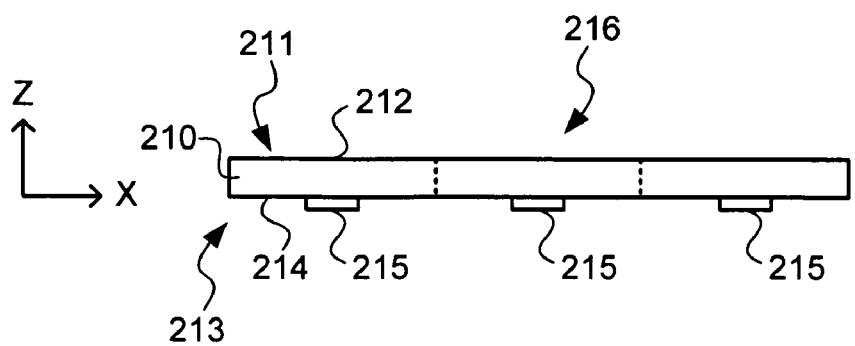
FIG. 5 is a partially schematic side view of the carrier shown in FIG. 4.

FIG. 4 is a partially schematic bottom plan view of a carrier 210 in accordance with selected embodiments of the present invention. FIG. 5 is a partially schematic side view of the carrier 210 shown in FIG. 4. The carrier 210 includes a first surface 212 on a first side 211 of the carrier 210 and a second surface 214 on a second side 213. The first side 211 and first surface 212 are at least approximately opposite the second side 213 and the second surface 214. The carrier in the illustrated embodiment also includes a passageway 216 extending from the first surface 212 of the carrier 210, through the carrier 210, to the second surface 214 of the carrier 210. The carrier 210 includes carrier contacts 215 that are carried on the second surface 214 of the carrier 210. The carrier contacts 215 can be used to operably couple (e.g., electrically connect) the image sensor module 220, shown in FIGS. 2 and 3, to the carrier 210. The carrier 210 can in turn carry and/or be coupled to other electrical devices or assemblies.

Figure 6:
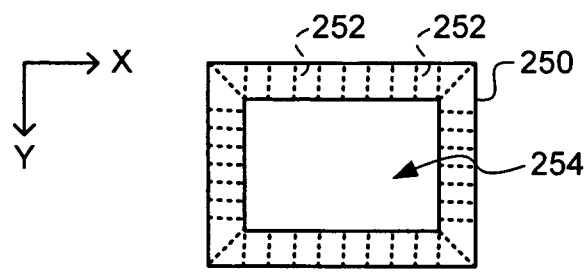
FIG. 6 is a partially schematic top plan view of a conductive deformable gasket element in accordance with certain embodiments of the present invention.

FIG. 6 is a partially schematic top plan view of a connecting element 250 that can be used to operably couple the carrier contacts 215 to the support contacts 245 of the camera module 220. In the illustrated embodiment, the connecting element 250 includes a conductive deformable gasket element. For example, at least a portion of the connecting element 250 can be made from a conductive elastomeric material comprised of conductive carbon elements 252 spaced apart by silicone rubber. Because the conductive carbon elements 252 run through the material in the Z direction, the carbon elements 252 can provide anisotropic conductance between a top of the connecting element 250 and the bottom of the connecting element 250. A suitable conductive elastomeric or conductive rubber material can be obtained from the Fujipoly American Corporation of Carteret, N.J. or from Connect2it, LLC of Incline Village, Nev.

In other embodiments, a conductive deformable gasket element can have other features. For example, in certain embodiments a conductive deformable gasket element can be made from organic and/or inorganic materials. In other embodiments, the conductive deformable gasket element has little or no elasticity or resiliency and can be permanently deformable. In still other embodiments, the conductive deformable gasket element can change conductive characteristics when compressed. For example, in selected embodiments the conductive deformable gasket element can have homogeneous conductivity (e.g., in the X, Y, and Z directions) with a high level of resistance until compressed. When the conductive deformable gasket element is compressed, the resistance can be lowered in the direction of compression to provide an electrical path with low resistance (e.g., conductive material in the conductive deformable gasket element can be compressed together to form an electrical path with low resistance). In yet other embodiments, the conductive deformable gasket element can be substantially nonconductive until the conductive deformable gasket element is compressed. When the conductive deformable gasket element is compressed, a conductive path can be formed in the direction of compression (e.g., conductive material in the conductive deformable gasket element can be compressed together to form a conductive path).

In the illustrated embodiment, the conductive deformable gasket element is a single piece element configured with a passageway through which the housing 222 of the image sensor module 220 can pass. Accordingly, the conductive deformable gasket element can slide over the housing 222 of the image sensor module 220 and cover the support contacts 245 of the image sensor module 220. The housing of the image sensor module 220 can then be passed through the passageway 216 in the carrier 210 with the conductive deformable gasket element 250 positioned between the support contacts 245 of the image sensor module 220 and the carrier contacts 215 of the carrier 210 (e.g., to operably couple and/or connect the support contacts 245 and the carrier contacts 215).

Figure 7:
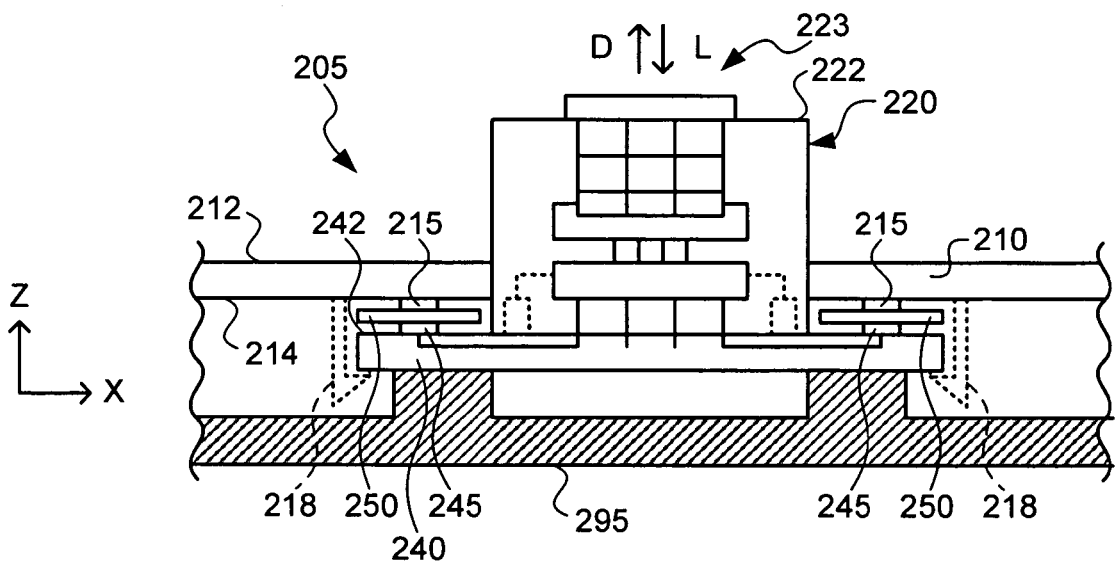
FIG. 7 is a partially schematic cross-sectional illustration of the image sensor module shown in FIG. 2 coupled to the carrier, shown in FIGS. 4 and 5, in accordance with various embodiments of the invention.
Figure 8:
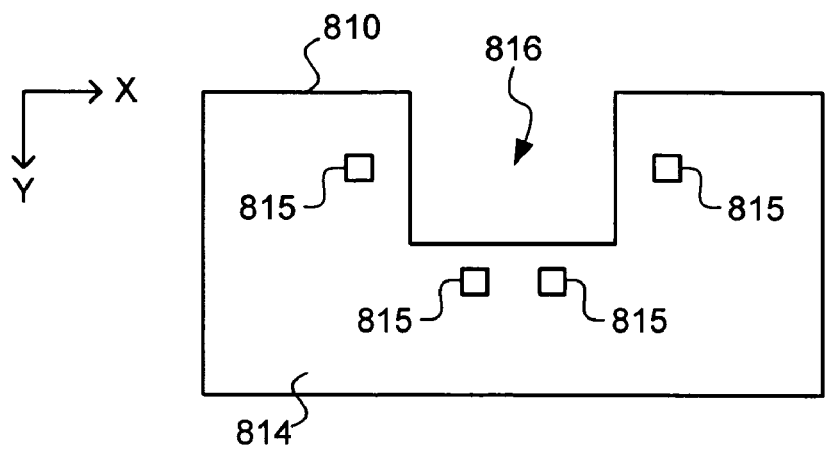
FIG. 8 is a partially schematic bottom plan view of a carrier in accordance with other embodiments of the present invention.
Figure 9:
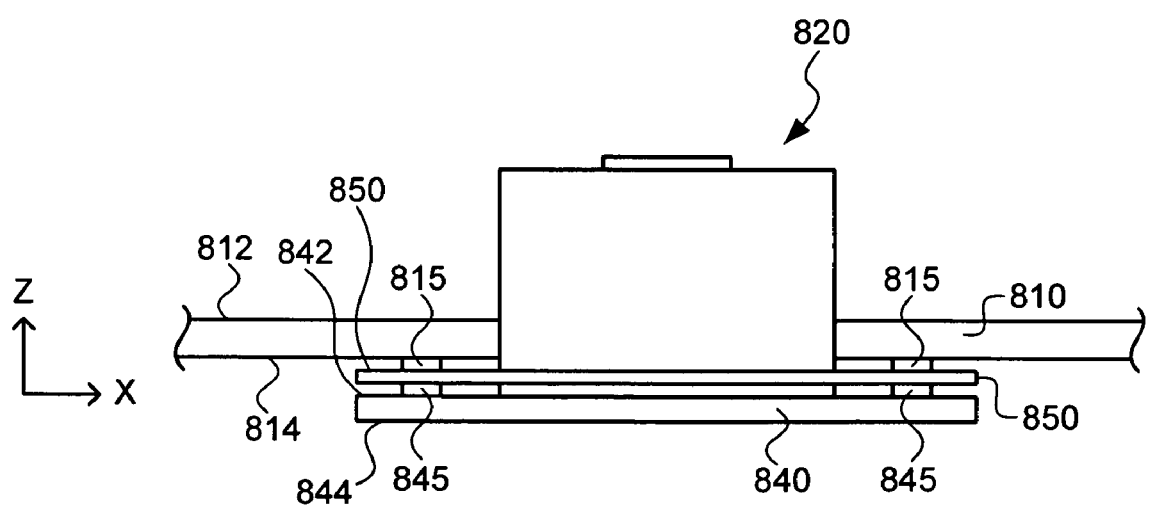
FIG. 9 is a partially schematic side elevation of an image sensor module coupled to the carrier shown in FIG. 8 in accordance with certain embodiments of the invention.

FIG. 7 is a partially schematic cross-sectional illustration of the image sensor module 220 (shown in FIG. 2) coupled to the carrier 210 (shown in FIGS. 4 and 5) to form a portion of an imaging device 205 (e.g., a portion of a cellular phone, a security camera, a medical camera, and/or other imaging device) in accordance with various embodiments of the invention. In FIG. 7, the image sensor module 220 is located relative to the carrier 210 so that a portion of the first surface 242 of the support 240 faces a portion of the second surface 214 of the carrier 210 with the connecting element 250 positioned between at least one of the carrier contacts 215 and the at least one of the support contacts 245 to operably couple the associated contacts. In the illustrated embodiment, at least a portion of the image sensor module 220 (e.g., a portion of the housing 222 and/or image sensor die 225) extends away from the support 240 and through the passageway 216 in the carrier 210 past the first and second surfaces 212 and 214 of the carrier 210. In other embodiments, the image sensing module 220 and carrier 210 combination can have other arrangements, including more, fewer, and/or different connecting elements 250. For example, in certain embodiments instead of using a one piece connecting element 250, a separate connecting element 250 can be used to connect individual corresponding pairs of carrier contacts 215 and support contacts 245.

In FIG. 7, the aperture 223 of the housing 222 is carried or located away from the first side 212 of the carrier opposite the second side 214 of the carrier 210. Therefore, light, indicated by Arrow L, can pass through the aperture 223 onto the light sensing elements 226. Accordingly, the direction of operation for the light sensing elements 226, the image sensor module 220, and the portion of the imaging device 205 is in the Z direction as indicated by Arrow D.

The image sensor module 220 can be held in place relative to the carrier 210 using various methods. For example, in the illustrated embodiment the sensor module 220 can be held in place by another element 295 of the imaging device 205. For example, if the imaging device 205 were a cellular phone the other element 295 of the imaging device 205 can include an exterior cover of the cellular phone. In other embodiments, other methods can be used to hold the image sensor module 220 in place relative to the carrier 210. For example, in certain embodiments portions of the image sensor module 220 can be glued to the carrier 210 and/or clips 218 (shown by ghosted lines) can be used to hold the image sensor module 220 in place.

A feature of some of the embodiments above is that a portion of the image sensor module 220 and a portion of the carrier 210 overlap in the Z direction. Therefore, the image sensor module 220 and carrier combination 210 can be made smaller in the Z direction as compared to current systems. An advantage of this feature is that imaging devices 205 using this arrangement can be made smaller.

In other embodiments, the image sensor module and the carrier can have other arrangements. For example, in another embodiment shown in FIGS. 8 and 9, a carrier 810 includes a first surface 812, a second surface 814 at least approximately opposite the first surface 812, a passageway 816 with an open side, and carrier contacts 815 carried on the second surface 814. An image sensor module 820 can be operably coupled to the carrier 810. The image sensor module 820 can have a support 840 with a first surface 842 and a second surface 844 at least approximately opposite the first surface 842. In the illustrated embodiment, the image sensor module 820 can be located relative to the carrier 810 so that a portion of a first surface 842 of the image sensor module 820 faces a portion of the second surface 814 of the carrier 810.

The first surface 842 of the image sensor module's support 810 carries support contacts 845. One or more connecting element(s) 850 can be positioned between at least one of the carrier contacts 815 and the at least one of the support contacts 845 to operably couple the associated contacts (shown in FIG. 9). In the illustrated embodiment, at least a portion of the image sensor module 820 extends away from the support 840, through the passageway 816 in the carrier 810, and past the first and second surfaces 812 and 814 of the carrier 810, similar to the arrangement shown in FIG. 7.

Figure 10:
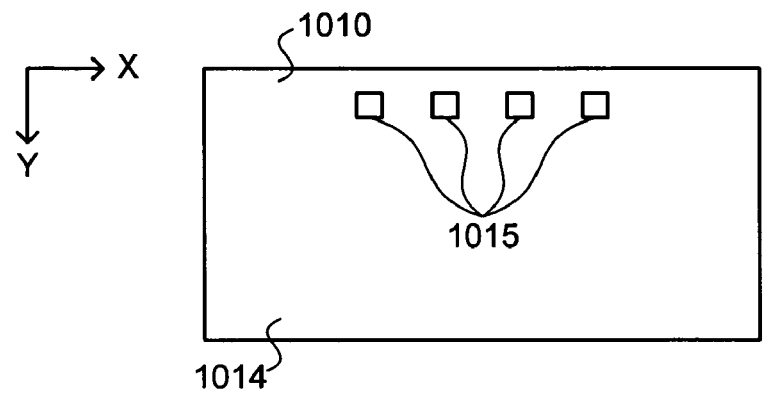
FIG. 10 is a partially schematic bottom plan view of a carrier in accordance with still other embodiments of the present invention.
Figure 11:
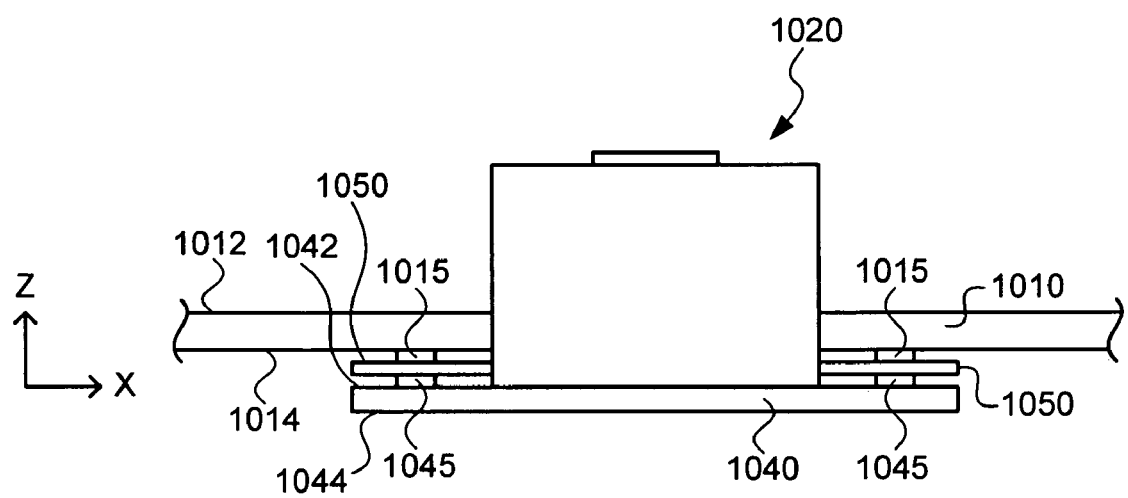
FIG. 11 is a partially schematic side elevation of an image sensor module coupled to the carrier shown in FIG. 10 in accordance with selected embodiments of the invention.

In yet another embodiment, shown in FIGS. 10 and 11, a carrier 1010 includes a first surface 1012 and a second surface 1014 at least approximately opposite the first surface 1012. The second surface 1014 of the carrier 1010 can carry carrier contacts 1015 (e.g., along one side). An image sensor module 1020 can be operably coupled to the carrier 1010. The image sensor module 1020 can have a support 1040 with a first surface 1042 and a second surface 1044 at least approximately opposite the first surface 1042. The image sensor module 1020 can be located relative to the carrier 1010 so that a portion of a first surface 1042 of the image sensor module 1020 (e.g., one side of the first surface 1042) faces a portion of the second surface 1014 of the carrier 1010 (e.g., one side of the second surface 1014).

In the illustrated embodiment, the first surface 1042 of the image sensor module's support 1010 carries support contacts 1045 (e.g., along one side). One or more connecting element(s) 1050 can be positioned between at least one of the carrier contacts 1015 and the at least one of the support contacts 1045 to operably couple the associated contacts. In the illustrated embodiment, at least a portion of the image sensor module 1020 extends away from the support 1040, and past the first and second surfaces 1012 and 1014 of the carrier 1010, similar to the arrangement shown in FIG. 7; but without using a passageway through the carrier 1010.

Figure 12:
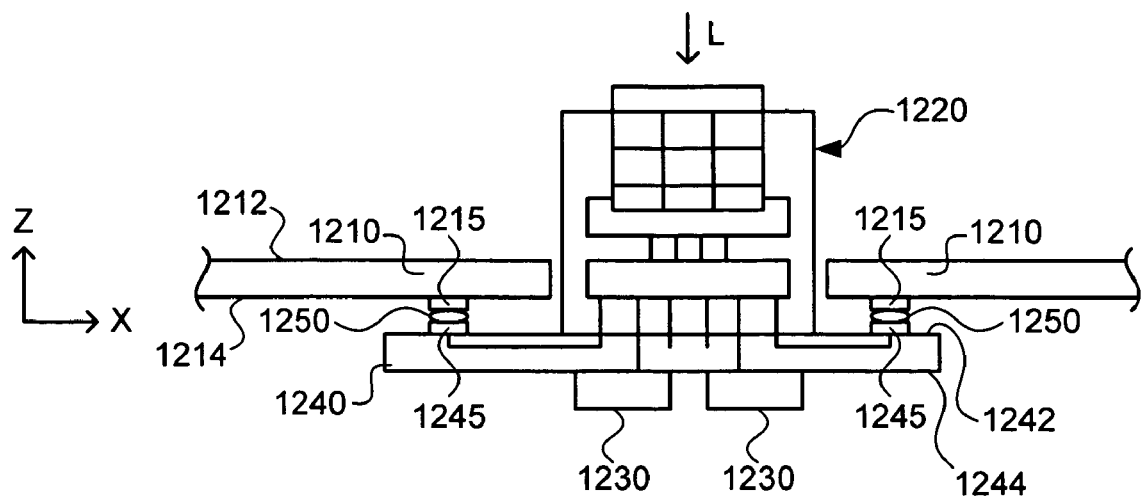
FIG. 12 is a partially schematic cross-sectional illustration of an image sensor module coupled to a carrier in accordance with yet other embodiments of the invention.

FIG. 12 is a partially schematic cross-sectional illustration of an image sensor module 1220 coupled to a carrier 1210 in accordance with yet other embodiments of the invention. The image sensor module 1220 in FIG. 12 is similar to the image sensor module shown in FIG. 2. The image sensor module 1220 includes, among other things, a support 1240 with a first surface 1242 and a second surface 1244 at least approximately opposite the first surface 1242. Support contacts 1245 can be carried on the first surface 1242 of the support 1240. In FIG. 12 the image sensor module 1220 includes electronic components 1230 (similar to the electronic components 230 shown in FIG. 2), however, the image sensor module 1220 carries the electronic components 1230 on the second surface 1244 of the support 1240. In other embodiments, the image sensor module 1220 can have other arrangements, including more, fewer, and/or different electronic components 1230.

In the illustrated embodiment, the image sensor module 1220 is operably coupled to a carrier 1210. The carrier 1210 includes a first surface 1212 and a second surface 1214 at least approximately opposite the first surface 1212. The second surface 1214 of the carrier 1210 can carry carrier contacts 1215. The image sensor module 1220 is located relative to the carrier 1210 so that a portion of a first surface 1242 of the image sensor module 1220 faces a portion of the second surface 1214 of the carrier 1210. In the illustrated embodiment, the image sensor module 1220 and the carrier 1210 are located relative to one another so that at least a portion of the image sensor module 1220 extends away from the support 1240 past the first and second surfaces 1212 and 1214 of the carrier 1210, similar to the arrangement shown in FIG. 7.

One or more connecting element(s) 1250 can be positioned between at least one of the carrier contacts 1215 and the at least one of the support contacts 1245 to operably couple the associated contacts. The connecting element(s) 1250 can include, but are not limited to, at least one of a conductive deformable gasket element (similar to that discussed above with reference to FIG. 7), a solder element, a solder ball (e.g., of a ball grid array), a frame (e.g., a socket and/or lead frame), a bond wire, and/or a conductive glue or adhesive. For example, a suitable conductive adhesive or glue with metallic or organic filling material can be obtained from Panacol-Elosol GmbH of Germany.

Figure 13:
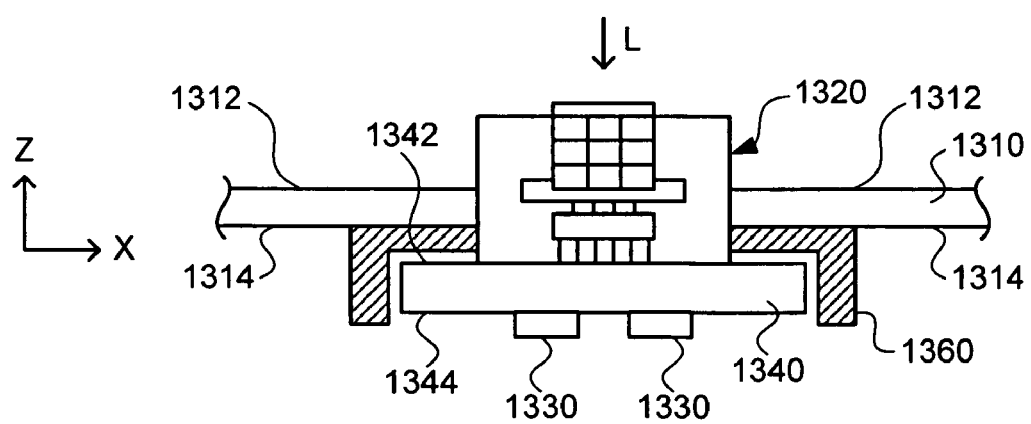
FIG. 13 is a partially schematic cross-sectional illustration of an image sensor module coupled to a carrier in accordance with still other embodiments of the invention.

For example, FIG. 13 is a partially schematic cross-sectional illustration of an image sensor module 1320 coupled to a carrier 1310 via a frame 1360 or a socket in accordance with yet other embodiments of the invention. In FIG. 13 the carrier 1310 includes a first surface 1312 and a second surface 1314 at least approximately opposite the first surface 1312. The second surface 1314 of the carrier 1310 can carry a frame 1360 that has electrical contacts for electrically coupling the image sensor module 1320 to the carrier 1310 (e.g., the frame can include a conductive spring assembly commonly used in socket devices). The image sensor module 1320 can include a support 1340 with a first surface 1342 and a second surface 1344 at least approximately opposite the first surface 1342. The support 1340 can be configured to mechanically and/or electrically couple the image sensor module 1320 to the frame 1360 on the carrier 1310 (e.g., via the electrical contacts of the frame 1360).

For example, the frame 1320 can releasably engage contacts on the first surface 1342 of the support 1340 and/or on the side(s) of the support 1340 that extend between the first surface 1342 and the second surface 1344. Accordingly, when the support 1340 is coupled to the frame 1360 the image sensor module 1320 can be located relative to the carrier 1310 so that a portion of a first surface 1342 of the image sensor module 1320 faces a portion of the second surface 1314 of the carrier 1310. In the illustrated embodiment, at least a portion of the image sensor module 1320 extends away from the support 1340 past the first and second surfaces 1312 and 1314 of the carrier 1310, similar to the arrangement shown in FIG. 7.

Figure 14:
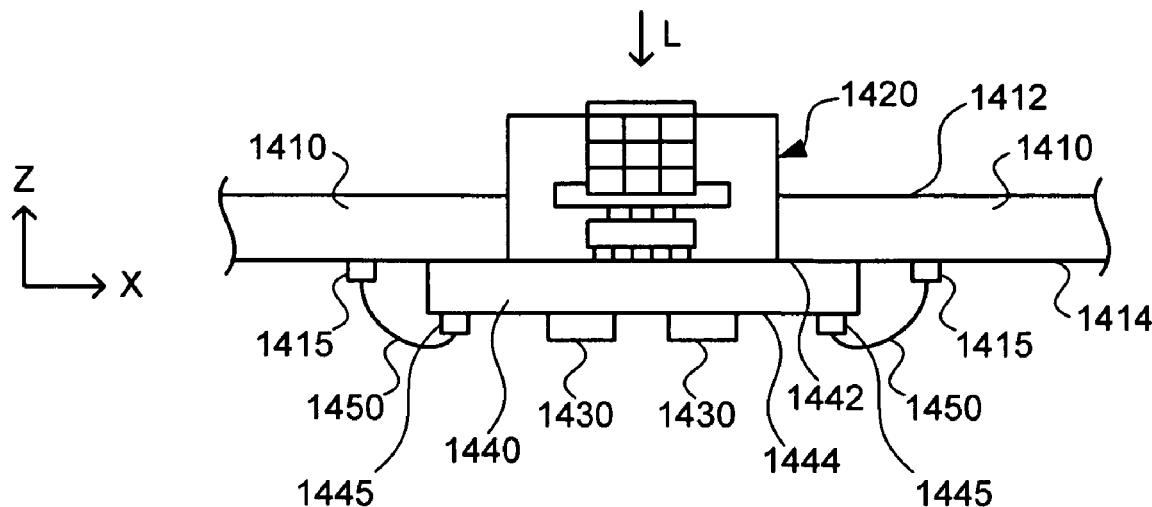
FIG. 14 is a partially schematic cross-sectional illustration of an image sensor module coupled to a carrier in accordance with yet other embodiments of the invention.

FIG. 14 is a partially schematic cross-sectional illustration of an image sensor 1420 module coupled to a carrier 1410 in accordance with still other embodiments of the invention. In FIGS. 14, the carrier 1410 includes a first surface 1412 and a second surface 1414 at least approximately opposite the first surface 1412. The second surface 1414 of the carrier 1410 can carry carrier contacts 1415. The image sensor module 1420 can include a support 1440 with a first surface 1442 and a second surface 1444 at least approximately opposite the first surface 1442. The image sensor module 1420 can be located relative to the carrier 1410 so that a portion of a first surface 1442 of the image sensor module 1420 faces a portion of the second surface 1414 of the carrier 1410.

In the illustrated embodiment, the second surface 1444 of the image sensor module's support 1410 carries support contacts 1445. In FIG. 14, one or more connecting element(s) 1450 (e.g., bond wire(s)) can be positioned between at least one of the carrier contacts 1415 and at least one of the support contacts 1445. In the illustrated embodiment, at least a portion of the image sensor module 1420 extends away from the support 1440 past the first and second surfaces 1412 and 1414 of the carrier 1410, similar to the arrangement shown in FIG. 7.

Figure 15:
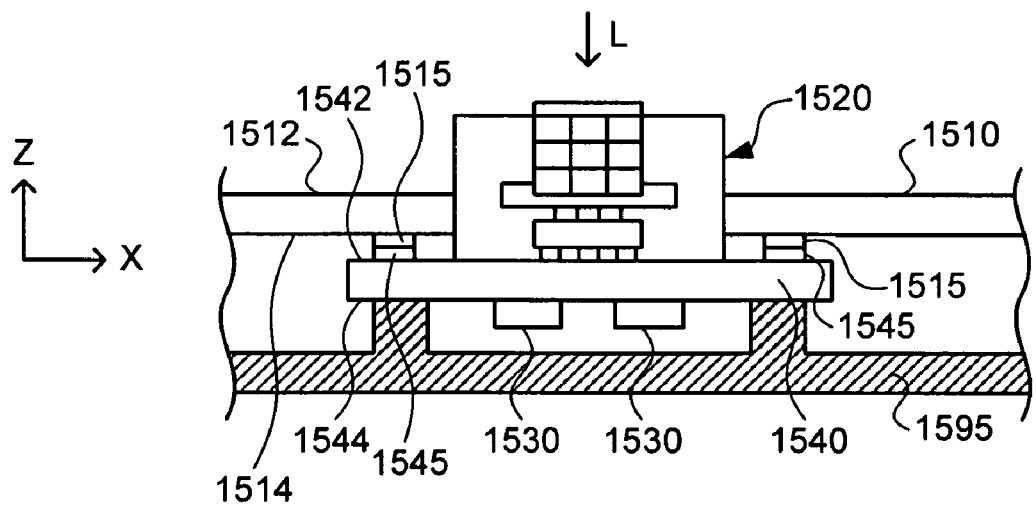
FIG. 15 is a partially schematic cross-sectional illustration of an image sensor module coupled to a carrier in accordance with still other embodiments of the invention.

In still other embodiments, at least one carrier contact of the carrier can be operably coupled to at least one support contact of the image sensor module without a connecting element. For example, FIG. 15 is a partially schematic cross-sectional illustration of an image sensor module 1520 coupled to a carrier 1510 in accordance with still other embodiments of the invention. In FIG. 15, the carrier 1510 includes a first surface 1512 and a second surface 1514 at least approximately opposite the first surface 1512. The second surface 1514 of the carrier 1510 can carry carrier contacts 1515. The image sensor module 1520 can include a support 1540 with a first surface 1542 and a second surface 1544 at least approximately opposite the first surface 1542. The image sensor module 1520 can be located relative to the carrier 1510 so that a portion of a first surface 1542 of the image sensor module 1520 faces a portion of the second surface 1514 of the carrier 1510.

In FIG. 15, the first surface 1542 of the image sensor module's support 1510 carries support contacts 1545. In the illustrated embodiment, at least a portion of the image sensor module 1520 extends away from the support 1540 past the first and second surfaces 1512 and 1514 of the carrier 1510, similar to the arrangement shown in FIG. 7. In FIG. 15, at least one of the carrier contacts 1515 is in contact with at least one of the support contacts 1545 so that the two contacts are operably coupled to one another. In selected embodiments, the sensor module 1520 can be held in place by another element 1595 of the imaging device, as discussed above with reference to FIG. 7. In still other embodiments, other techniques can be used to couple (e.g., mechanically and/or electrically) the image sensor module 1520 to the carrier 1510, including those disclosed in U.S. patent application Ser. No. 10/760,120, entitled PLACEMENT OF A CAMERA MODULE IN A PORTABLE DEVICE, filed Jan. 16, 2004, which is fully incorporated by reference herein.

Some of the embodiments discussed above with reference to FIGS. 8-15 have features and advantages similar to those discussed above with reference to FIGS. 2-7. Additionally, in certain embodiments where the image sensor module carries electronic components on a second surface of a support, the width of the camera module can be reduced over camera modules where the electronic components are carried inside a housing. In other embodiments, carrying electronic components on the second surface of the support can produce an image sensor module/carrier combination having a shape and volume distribution conducive to certain imaging devices (e.g., a cellular phone that has unoccupied space between the second surface of the image sensor module and the outer case). Accordingly, this feature can allow designers the flexibility to reduce the size of an image sensor module/carrier combination and/or distribute the volume of the image sensor module/carrier combination to accommodate selected applications.

From the foregoing, it will be appreciated that specific embodiments of the invention have been described herein for purposes of illustration, but that various modifications may be made without deviating from the invention. Accordingly, the invention is not limited except as by the appended claims.

I claim:
1. An imaging device, comprising:
   a carrier having a first surface, a second surface generally opposite the first surface, and carrier contacts, the carrier contacts being carried on the second surface of the carrier;
   a conductive deformable gasket element; and
   an image sensor module having light sensing elements and a support, the support having a first surface, a second surface generally opposite the first surface, and support contacts, the support contacts being carried on the first surface of the support, the light sensitive elements being coupled to the first surface of the support and located relative to the support at least approximately opposite the second surface of the support, the image sensor module being located relative to the carrier so that a portion of the first surface of the support faces a portion of the second surface of the carrier with the conductive deformable gasket element positioned between at least one of the carrier contacts and at least one of the support contacts to operably couple the at least one support contact to the at least one carrier contact, at least a portion of the image sensor module extending away from the support past the first and second surfaces of the carrier.

2. The device of claim 1 wherein the image sensor module includes a housing carried on the first surface of the support, the light sensing elements being carried inside the housing.

3. The device of claim 1 wherein the image sensor module includes an image sensor die with integrated circuits, at least one other optical device, and a housing with an aperture configured to allow light to pass from the exterior of the housing to the interior of the housing, the image sensor die carrying the light sensing elements and being positioned so that light can pass from the exterior of the housing through the aperture and onto the light sensing elements, the aperture being located away from the first side of the carrier opposite the second side of the carrier.

4. The device of claim 1 wherein the carrier has a passageway extending between the first and second sides of the carrier, the portion of the image sensor module extending away from the support past the first and second sides of the carrier extending through the passageway.

5. The device of claim 1 wherein the light sensing elements have a direction of operation that extends in the same general direction that the first side of the support faces.

6. The device of claim 1 wherein the image sensor module includes an image sensor die that carries the light sensing elements, the image senor die being coupled to the first surface of the support.

7. The device of claim 1 wherein the conductive deformable gasket element includes a conductive elastomeric element.

8. An imaging device, comprising:
   a carrier having a first surface, a second surface at least approximately opposite the first surface, and carrier contacts; and
   an image sensor module having light sensing elements, an electronic component, and a support, the support having a first surface, a second surface at least approximately opposite the first surface, and support contacts, the electronic component being carried on the second surface of the support, the light sensitive elements being coupled to the first surface of the support and located relative to the support at least approximately opposite the second surface of the support, the image sensor module being located relative to the carrier so that a portion of the first surface of the support faces a portion of the second surface of the carrier with at least one of the support contacts being operably coupled to at least one of the carrier contacts, at least a portion of the image sensor module extending away from the support past the first and second surfaces of the carrier.

9. The device of claim 8 wherein:
the carrier contacts are carried on the second surface of the carrier; and
the support contacts are earned on the first surface of the support.

10. The device of claim 8 wherein the image sensor module includes a housing carried on the first surface of the support, the light sensing elements being carried inside the housing.

11. The device of claim 8 wherein the at least one of the support contacts is operably coupled to the at least one of the carrier contacts via at least one of a bond wire, a conductive deformable gasket element, a conductive adhesive, a solder element, a frame, a conductive spring assembly, and a solder ball of a ball grid array.

12. The device of claim 8 wherein the image sensor module includes an image sensor die with integrated circuits, at least one other optical device, and a housing with an aperture configured to allow light to pass from the exterior of the housing to the interior of the housing, the image sensor die carrying the light sensing elements and being positioned so that light can pass from the exterior of the housing through the aperture and onto the light sensing elements, the aperture being located away from the first side of the carrier opposite the second side of the carrier.

13. The device of claim 8 wherein the carrier has a passageway extending between the first and second sides of the carrier, the portion of the image sensor module extending away from the support past the first and second sides of the carrier extending through the passageway.

14. The device of claim 8 wherein the light sensing elements have a direction of operation that extends in the same general direction that the first side of the support faces.

15. The device of claim 8 wherein the image sensor module includes an image sensor die that carries the light sensing elements, the image sensor die being coupled to the first surface of the support.

16. A method for making an imaging device, comprising:
selecting a carrier having a first surface, a second surface at least approximately opposite the first surface, and carrier contacts; and
positioning an image sensor module relative to the carrier so that a portion of a first surface of a support of the image sensor module faces a portion of the second surface of the carrier and so at least a portion of the image sensor module extends away from the support past the first and second surfaces of the carrier, a second surface of the support being at least approximately opposite the first surface of the support, the image sensor module having light sensing elements, an electronic component, and support contacts, the electronic component being carried on the second surface of the support, the light sensitive elements being coupled to the first surface of the support and located relative to the support at least approximately opposite the second surface of the support; and
operably coupling at least one of the support contacts to at least one of the carrier contacts.

17. The method of claim 16 wherein:
the carrier contacts are carried on the second surface of the carrier; and
the support contacts are carried on the first surface of the support.

18. The method of claim 16 wherein the image sensor module includes a housing carried on the first surface of the support, the light sensing elements being carried inside the housing.

19. The method of claim 16 wherein operably coupling at least one of the support contacts to at least one of the carrier contacts includes operably coupling at least one of the support contacts to at least one of the carrier contacts via at least one of a bond wire, a conductive deformable gasket element, a conductive adhesive, a solder element, a frame, a conductive spring assembly, and a solder ball of a ball grid array.

20. The method of claim 16 wherein the image sensor module includes an image sensor die with integrated circuits, at least one other optical device, and a housing with an aperture configured to allow light to pass from the exterior of the housing to the interior of the housing, the image sensor die carrying the light sensing elements and being positioned so that light can pass from the exterior of the housing through the aperture and onto the light sensing elements, the aperture being located away from the first side of the carrier opposite the second side of the carrier.

* * * * *

UNITED STATES PATENT AND TRADEMARK OFFICE
CERTIFICATE OF CORRECTION

PATENT NO. : 7,268,335 B2  Page 1 of 1
APPLICATION NO. : 11/342107
DATED : September 11, 2007
INVENTOR(S) : Hiltunen It is certified that error appears in the above-identified patent and that said Letters Patent is hereby corrected as shown below:

In Claim 6, Line 3 delete "senor" and replace with -- sensor --.

In Claim 9, Line 4 delete "earned" and replace with -- carried --.

Signed and Sealed this

Twenty-ninth Day of June, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,268,335 B2 | Page 1 of 1 |
| APPLICATION NO. | : 11/342107 | |
| DATED | : September 11, 2007 | |
| INVENTOR(S) | : Hiltunen | |

It is certified that error appears in the above-identified patent and that said Letters Patent is hereby corrected as shown below:

Column 10, line 49 (Claim 6, Line 3) delete "senor" and replace with -- sensor --.

Column 11, line 10 (Claim 9, Line 4) delete "earned" and replace with -- carried --.

This certificate supersedes the Certificate of Correction issued June 29, 2010.

Signed and Sealed this

Twentieth Day of July, 2010

David J. Kappos
*Director of the United States Patent and Trademark Office*